(12) United States Patent
Varshney et al.

(10) Patent No.: US 8,608,850 B1
(45) Date of Patent: Dec. 17, 2013

(54) LOW-ENERGY, HYDROGEN-FREE METHOD OF DIAMOND SYNTHESIS

(75) Inventors: Deepak Varshney, San Juan, PR (US); Gerardo Morell, Guaynabo, PR (US); Brad R. Weiner, Dorado, PR (US); Vladimir Makarov, San Juan, PR (US)

(73) Assignee: The University of Puerto Rico, San Juan, PR (US)

( * ) Notice: Subject to any disclaimer, the term of this patent is extended or adjusted under 35 U.S.C. 154(b) by 974 days.

(21) Appl. No.: 12/689,224

(22) Filed: Jan. 18, 2010

Related U.S. Application Data

(60) Provisional application No. 61/145,277, filed on Jan. 16, 2009.

(51) Int. Cl.
*C30B 29/04* (2006.01)

(52) U.S. Cl.
USPC ............ 117/103; 117/104; 117/929; 423/446

(58) Field of Classification Search
USPC ........................... 117/929, 104, 103; 423/446
See application file for complete search history.

(56) References Cited

U.S. PATENT DOCUMENTS

| | | | | |
|---|---|---|---|---|
| 5,328,676 | A | * | 7/1994 | Gruen ........................... 423/446 |
| 5,449,531 | A | * | 9/1995 | Zhu et al. .................... 427/249.8 |
| 5,462,776 | A | * | 10/1995 | Gruen ........................... 427/577 |
| 7,687,146 | B1 | * | 3/2010 | Freitas, Jr. .................... 428/408 |
| 2007/0020403 | A1 | * | 1/2007 | Yoshitake et al. ............. 427/586 |

* cited by examiner

*Primary Examiner* — Bob M Kunemund
(74) *Attorney, Agent, or Firm* — Hoglund & Pamias, PSC; Roberto J. Rios

(57) ABSTRACT

Diamond thin films were deposited on copper substrate by the Vapor Solid (VS) deposition method using a mixture of fullerene $C_{60}$ and graphite as the source material. The deposition took place only when the substrate was kept in a narrow temperature range of approximately 550-650° C. Temperatures below and above this range results in the deposition of fullerenes and other carbon compounds, respectively.

19 Claims, 6 Drawing Sheets

LOW-ENERGY, HYDROGEN-FREE METHOD OF DIAMOND SYNTHESIS

GOVERNMENT INTEREST

The claimed invention was made with U.S. Government support under grant number NNX07AO30A awarded by the National Aeronautics and Space Administration (NASA). The government has certain rights in this invention.

BACKGROUND OF THE INVENTION

Diamond outshines all other gemstones as a symbol of wealth and prestige till date, but apart from its appeal as a gemstone, it possesses a remarkable range of unique physical properties such as high thermal conductivity at room temperature, highest hardness and lowest compressibility that render it to be the subject of intense recent research interest and establish it as the best solid state material. It is considered as an ideal material for varied applications such as: cutting tools, coating magnetic disks, optical switches, electronic devices, spintronic devices and quantum computation. Diamond has tremendous potential but the cost of its production using current technologies is high, thus, significantly limiting the development of products incorporating diamond.

Extensive research is being carried out worldwide on the various aspects of diamond formation. The initial process used for diamond synthesis was inspired by the natural diamond formation that takes place under High Temperature and High Pressure (HPHT) but it resulted in single crystal diamond that was inefficient for many applications. The current technology that is being used for diamond production employs a costly infrastructure and the expenditure incurred is high thus, significantly limiting the development of products incorporating diamond. Currently, CVD is the most exploited technology for diamond synthesis yet its commercialization is still in its beginnings. Researchers and Engineers are currently concentrating upon developing a method to scale up the CVD process.

Since the discovery of fullerenes, researchers have been fascinated by these spherical carbon molecules that have a bonding intermediate of graphite ($sp^2$) and diamond ($sp^3$). Fullerenes have been used as catalyst to deposit diamond films on various substrates and it was observed that a thin layer of fullerene increased diamond formation by about 10 orders of magnitude. U.S. Pat. No. 5,209,916 discloses a process of obtaining synthetic diamond film on a diamond or fullerene coated substrate by impinging a beam of accelerated fullerene ions on it. It has also been described the process of transformation of fullerenes to diamond by collisional fragmentation of fullerene in argon microwave plasma, but the process was elaborate and energy consuming as it required the fragmentation of fullerene molecules to fullerene ions and subsequently accelerating the ions to bombard the substrate. It has further been reported the use of fullerene $C_{60}$ as co-catalyst for HPHT synthesis of diamonds. Inspite the development of processes for diamond synthesis employing fullerene, there exists a need for a method that can cover large surfaces cheaply and completely and reduce the production cost to a point at which it becomes economically viable to use diamond as a material of choice.

SUMMARY OF THE INVENTION

The present invention is successful in employing the simple VS process for growing diamond film on a Cu substrate using fullerene $C_{60}$ and graphite as the source material. The present method is a simple method that overcomes the shortcomings of the conventional process.

According to an aspect of the invention, the process is carried out at a very low temperature and in the absence of gases such as but not limited to: $H_2$ and $CH_4$, that are essentially used in the conventional CVD process.

According to another aspect of the invention, the process also excludes the use of high temperature-high pressure or even an energy source that is employed for fragmentation of fullerene molecules in the prior art procedures for fullerene-aided diamond growth. Thus, this novel process is highly economic in terms of energy as well as reaction conditions and is easy to handle, as it does not require a complex and costly infrastructure.

In accordance with an aspect of the invention, this novel process provides an economical process of diamond deposition from fullerene in presence of graphite.

According to a further aspect of the invention, a low-energy, hydrogen-free process of diamond film deposition comprises providing a source mixture of fullerene and graphite in an evacuated zone furnace; subjecting the source to a temperature in the range of 550-1000° C.; placing a diamond seeded substrate in a cooler zone with respect to the source, wherein the substrate is a metal that neither forms carbide nor dissolves carbon; passing a carrier gas through the tube; cooling the furnace to room temperature; and obtaining a diamond film on the substrate.

According to an aspect of the invention, the reaction time of the diamond deposition process is at least 15 minutes. The reaction time can be varied according to the desired thickness of the diamond film.

According to another aspect of the invention, the fullerene is C60.

According to yet another aspect of the invention, the process of conversion of fullerene to diamond in the presence of graphite comprises subjecting the substrate to a temperature not exceeding 700° C. in an evacuated zone furnace.

According to a further aspect of the invention, the carrier gas is a non-reacting gas. The non-reacting gas is selected from nitrogen, helium, neon, argon, krypton and xenon.

According to an aspect of the invention, the fullerene and graphite are present in a ratio in the range of 9:1 to 1:1.

According to another aspect of the invention, the substrate is Cu, Ag or Au. The substrate is diamond seeded and kept at a temperature not exceeding 700° C.

According to an additional aspect of the invention, a Vapor Solid (VS) process of diamond deposition is provided that is cost effective and simple. The novel process does not involve any fragmentation or plasma formation from fullerene.

In accordance with an aspect of the invention, the novel method provides an energy effective process of diamond deposition on a non carbide forming and non-carbon dissolving substrate using fullerene in presence of graphite at a substrate temperature not exceeding 700° C.

According to a further aspect of the invention, this novel process could enable the heteroepitaxial growth of single crystal diamond for high-power electronics and optical applications at highly reduced costs as well as time.

BRIEF DESCRIPTION OF THE INVENTION

Further features and advantages of the invention will become apparent from the following detailed description taken in conjunction with the accompanying figures showing illustrative embodiments of the invention, in which.

DETAILED DESCRIPTION OF THE INVENTION

Experimental Setup

Figure 1:
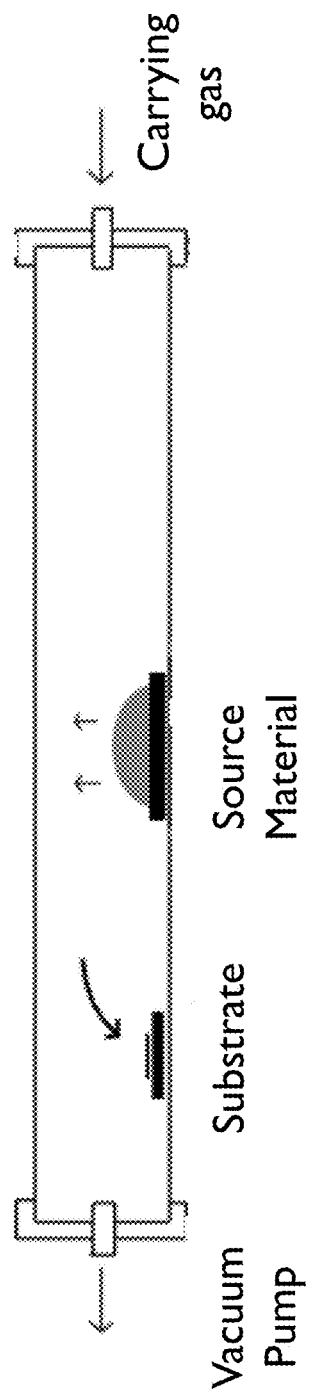
FIG. 1 shows a schematic representation of the VS/VLS reactor according to the present invention.

The process was carried out in a horizontal Catalytic Vapor Solid (CVS) reactor assembly as shown in FIG. 1. The assembly comprises a 80 cm long quartz tube with an external and internal diameter of 37 and 35 mm, respectively. The quartz tube was installed with a programmed oven and connected to a high pressure nitrogen tank on one side and to a mechanical pump on the other. A mixture of commercially available fullerene and graphite in a molar ratio of 1:1 were used as the source material for deposition of the fullerene-$C_{60}$ thin layers. The commercial Copper substrate was used and a high purity nitrogen gas was utilized as a carrier.

Procedure of the Thin Film Deposition

Mixture of fullerene (0.5 g) and graphite (0.5 g) powder was placed in the commercial alumno boat at the center of the quartz tube as shown in FIG. 1. Copper substrates were polished with diamond powder (0.1-0.2 µm) to obtain a mirror like surface. The polished substrate was ultrasonicated in 20 ml isopropanol for 20 min, dried in dry nitrogen gas and subsequently placed in the quartz tube at a distance of about 17-18 cm from the source material as illustrated in FIG. 1. The temperature of the reactor was fixed at 950° C. and the substrate was placed at a temperature in the range of ~550-650° C. A pressure in the range of 15-20 torr was used. $N_2$ gas was passed through the evacuated tube for 45 min and then the reactor assembly was cooled to room temperature.

Results and Discussion

Figure 2:
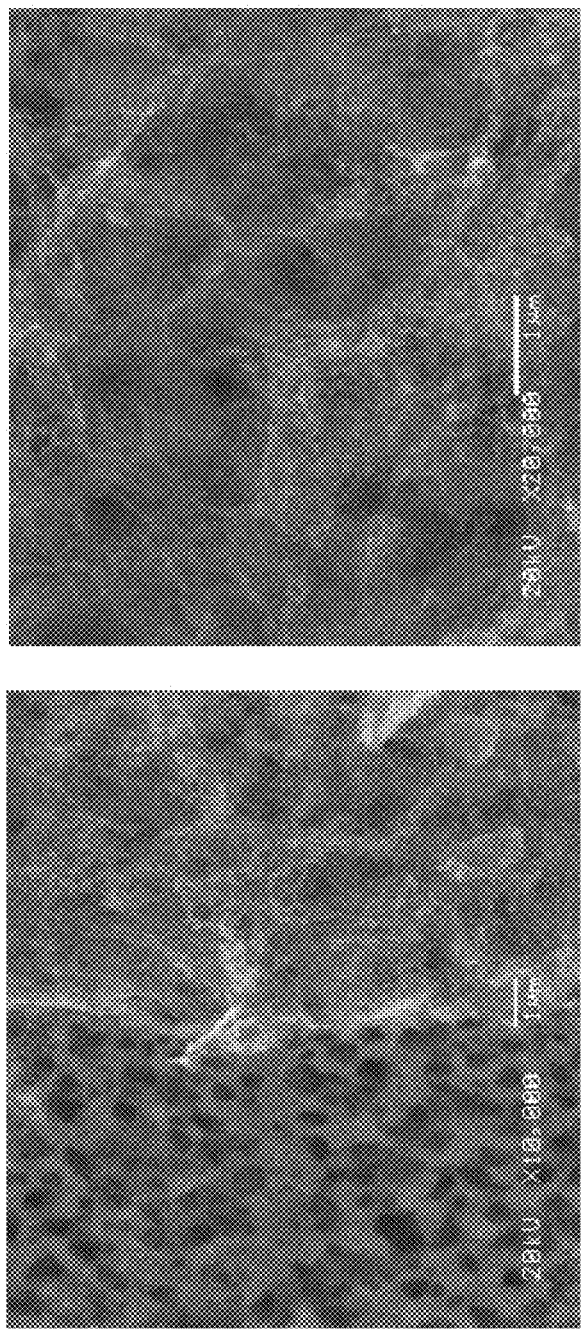
FIG. 2 shows SEM images of thin diamond films according to the present invention.

The morphology of the deposited diamond thin films was gauged by the SEM analysis carried on a JEOL JSM 648 OLV Model microscope. The obtained film was very thin and transparent in nature as can be seen from FIG. 2b. The diamond deposition was obtained on 80% of the substrate surface. The undeposited and the deposited substrate surface can be differentially seen in FIG. 2. It may be assumed that the diamond thin layer consists of a few atomic layers of carbon with $sp^3$ hybridization.

Figure 3:
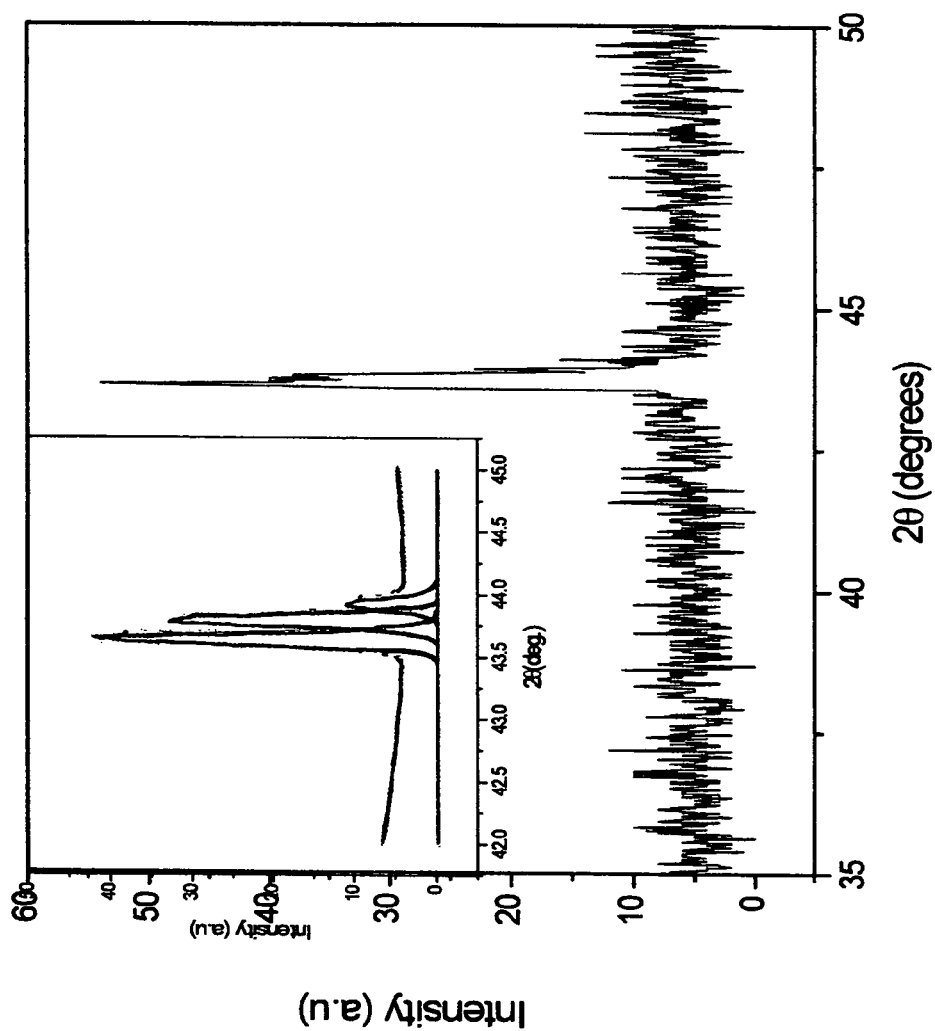
FIG. 3 shows plots of XDR spectrum of the diamond thin film of interest, XRD spectrometer and conditions of the spectrum recording in accordance with the present invention.

The X-ray analysis was used to assess the quality of the deposited diamond films. XRD patterns were studied on a Siemens D5000 Diffractometer using the Cu Kα line source (k=1.5405 A°) in θ-2θ configuration. FIG. 3 shows the XRD pattern obtained for the deposited diamond film. The sharp peak at a 2θ value of 43.6° was deconvoluted using PEAK FIT and peaks at 2θ values of 43.64°, 43.79° and 43.9° were obtained as shown in the Inset plot in FIG. 3. These values correspond exclusively to diamond <111> lattice [21]. FWHM is a suitable parameter to estimate the quality of the deposited diamond film and hence it was calculated for the above-mentioned peaks. The obtained value of 0.11453 indicates the fine quality of the deposited film.

Figure 4:
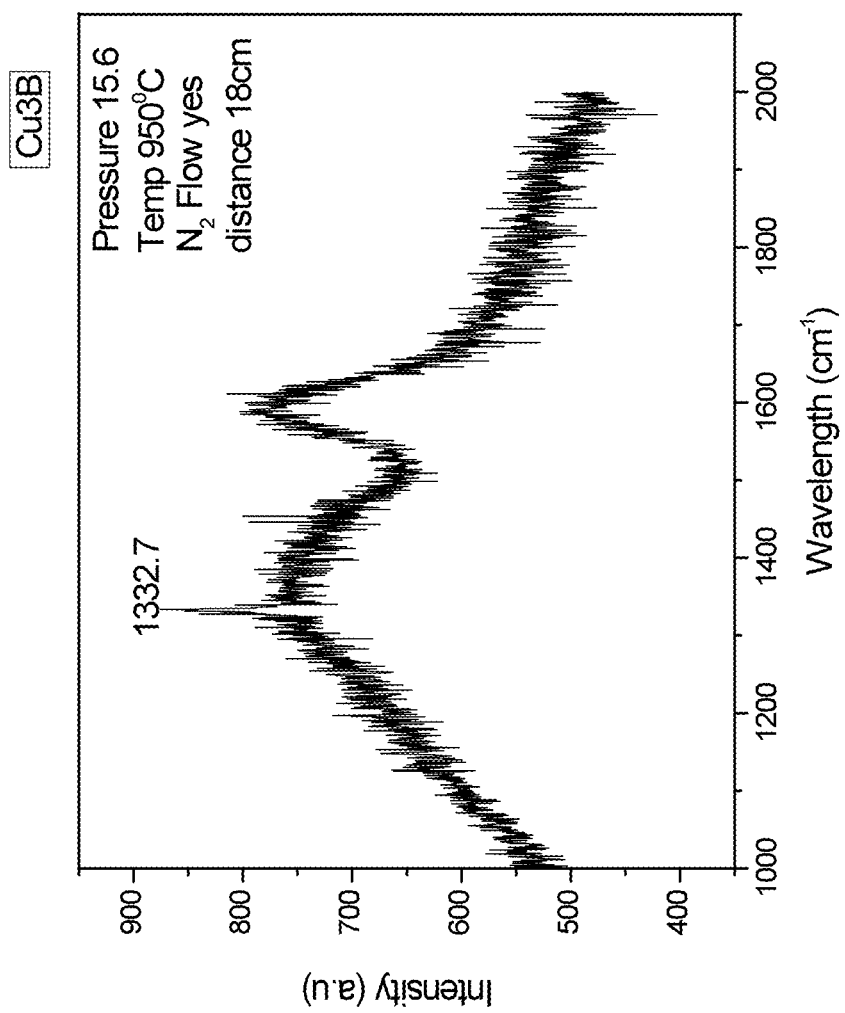
FIG. 4 shows Raman Scattering spectrum of the diamond thin film of interest, Raman spectrometer and conditions of the spectrum recoding according to the present invention.

The obtained diamond films were also characterized using Raman Spectroscopy that was conducted on a triple monochromatic (ISA Jobin-Yvon Inc. Model T64000) with 1 $cm^{-1}$ resolution and the 514.5 nm Ar-ion laser line for excitation. FIG. 4 shows the Raman scattering spectrum that unambiguously certifies the identity of the deposited thin film. The Raman scattering spectrum is obtained in the range of 1000-2000 $cm^{-1}$ and it shows a sharp band at 1332-1335 $cm^{-1}$ that corresponds to the stretching vibration of tetrahedrally ($sp^3$) bonded diamond lattice that is a conclusive characteristic of the diamond feature, and an additional band of non-diamond carbon (graphite band/G band) corresponds to $sp^2$ hybridized carbon atom at 1590 $cm^{-1}$.

Figure 5:
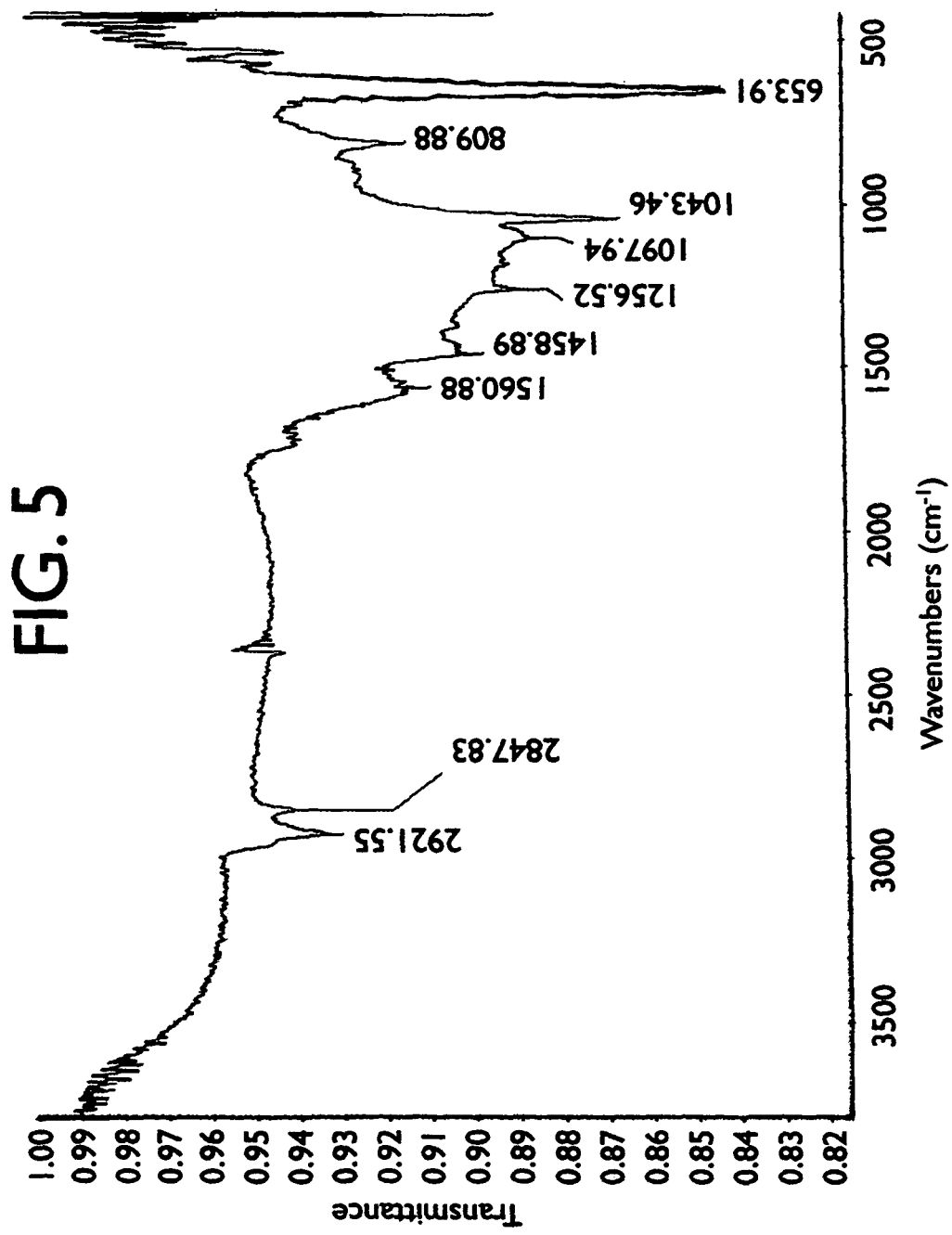
FIG. 5 shows FTIR spectrum of the diamond thin film of interest, FTIR spectrometer and conditions of the spectrum recoding according to the present invention.

The IR spectrum for the obtained films was recorded on a BRUKER TENSOR 27. FIG. 5 shows high influence of the irrational spectra of functional groups such as C═O, C═C, C—C, H—C═O and other carbonyl compounds. The figure also shows the absorption band in the range 3000-2800 $cm^{-1}$, 1860-1580 $cm^{-1}$, 1400-790 $cm^{-1}$ and 600-490 $cm^{-1}$.

Figure 6:
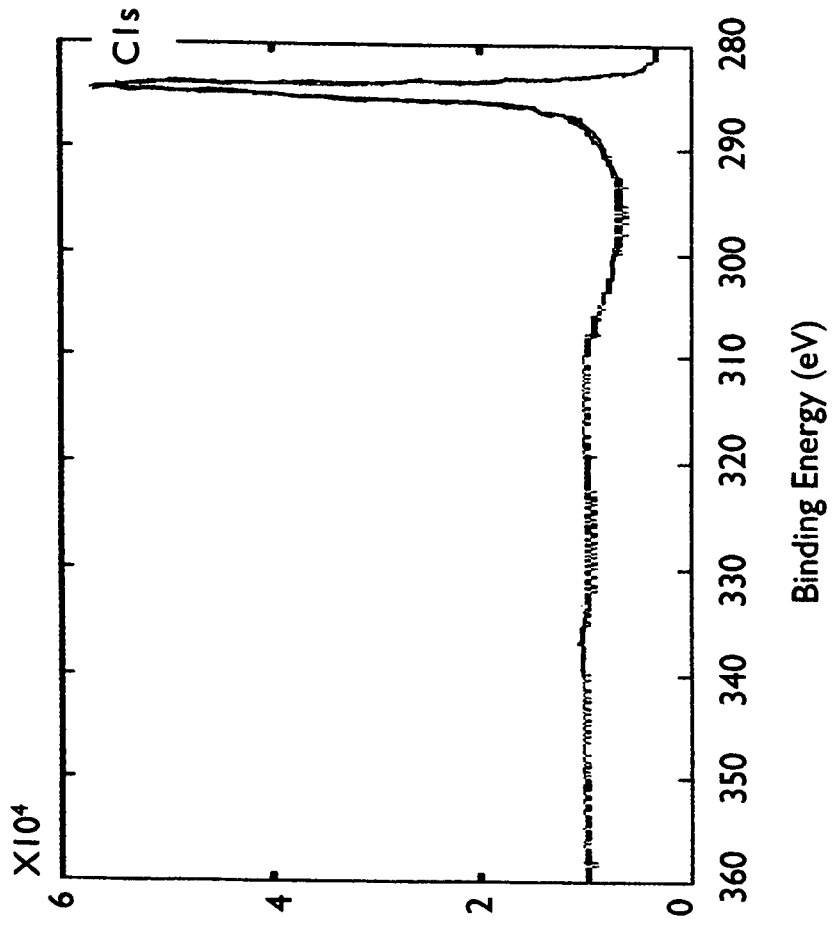
FIG. 6 shows XPS spectrum of the diamond thin film of interest, XPS spectrometer and conditions of the spectrum recoding according to the present invention.

Raman spectroscopy essentially characterizes the bulk properties of transparent material but electrochemistry is associated with the surface properties. Therefore, the average bonding environment of the material was studied using XPS. The Carbon is core spectrum, shown in FIG. 6, indicates the strong presence of a tetrahedral carbon ($sp^3$), as reported in literature. The XPS spectrum reinforces the conclusion drawn from the Raman spectrum.

The deposition of diamond depends significantly on the substrate property. The Cu substrate that neither forms carbide nor dissolves carbon, gave successful deposition of diamond while attempts of diamond synthesis on silicon and molybdenum substrate proved unsuccessful. It was found that even the copper substrate resulted in diamond deposition only in the temperature range of ~550-650° C. It was observed, that above and below this range fullerene layer deposition took place instead of diamond.

The model presented provides a qualitative understanding of the experimentally observed low-energy, low-pressure, hydrogen-free mechanism for diamond synthesis from a mixture of fullerene and graphite powder on a diamond-seeded Cu substrate. The fullerene and graphite powders were mixed together and heated. The vapor travels to a cooler zone and deposits over the substrate having diamond seeds incrusted all over its surface. This diamond synthesis method makes use of the free energy stored in the fullerene molecule during its formation, which manifests itself in the form of intermediate hybridization characteristic of the fullerenes, and requires the concerted interaction among fullerene, graphite and diamond seeds.

According to this mechanism, fullerene becomes localized at the edges of graphene sheets in a cycloaddition reaction to form adamantine-like structures without hydrogen. Cycloaddition changes two carbon atoms of graphite from the $sp^2$-state to the $sp^a$-state, thus perturbing a region on the graphene sheet. Simultaneously, the pairs of C atoms in the fullerene skeleton undergo similar transformations. Once deposited on the substrate material, each fullerene molecule accepts up to six electrons, since the lowest unoccupied molecular orbital of fullerene is an anti-bonding three-fold degenerate orbital. The resulting repulsion between the delocalized electrons weakens the C—C bonds of the fullerene cage and prepares the fullerene-adamantine complex to undergo diamond transformation. The diamond seeds act as template and the carbon atoms of the newly ruptured C—C bond of the fullerene-adamantine complex adopts the $sp^3$ hybridization required for diamond growth.

CONCLUSION

A simple and cost-effective method for the deposition of diamond film on a copper substrate is described. The method is devoid of any external energy source used in conventional fullerene aided diamond synthesis. The experimental results indicate that the diamond deposition is significantly dependent on the substrate temperature and it takes place at a temperature in the range of 550-650° C. The XRD and Raman spectra are indicative of the high quality of the deposited diamond film.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

The invention claimed is:

1. A low-energy, Hydrogen-free method of synthesizing diamond comprising:
    providing a source mixture of fullerene and graphite in an evacuated zone furnace;
    subjecting said source mixture to a first temperature;
    positioning a substrate in an area inside said furnace having a second temperature lower than said first temperature;
    directing a carrier gas through said furnace;
    cooling said furnace; and
    obtaining a diamond film on said substrate.

2. The method of claim 1, wherein said fullerene is fullerene-$C_{60}$.

3. The method of claim 1, wherein said first temperature comprises from about 550° C. to about 1,000° C.

4. The method of claim 1, wherein said substrate comprises a diamond-seeded substrate.

5. The method of claim 1, wherein said substrate comprises a metal.

6. The method of claim 1, wherein said substrate comprises copper (Cu).

7. The method of claim 1, wherein said substrate comprises gold (Au).

8. The method of claim 1, wherein said substrate comprises silver (Ag).

9. The method of claim 1, wherein said substrate neither forms carbide nor dissolves carbon.

10. The method of claim 1, wherein said substrate is kept at said second temperature; said second temperature does not exceed 700° C.

11. The method of claim 1, wherein said carrier gas comprises a non-reacting gas.

12. The method of claim 1, wherein said carrier gas is selected from the group consisting of: nitrogen, helium, neon, argon, krypton and xenon.

13. The method of claim 1, wherein the step of cooling said furnace comprises: cooling said furnace to room temperature.

14. The method of claim 1, wherein the reaction time for a process of diamond deposition is at least 15 minutes.

15. The method of claim 1, wherein said mixture of fullerene and graphite comprises: fullerene and graphite in a molar ratio of from about 9:1 to about 1:1.

16. The method of claim 1, wherein said substrate is kept at a temperature of from about 550° C. to about 650° C.

17. The method of claim 1, wherein said substrate is positioned at a distance of from about 17 cm to about 18 cm from said source mixture.

18. The method of claim 1, wherein the method was performed at a pressure of from about 15 Torr to about 20 Torr.

19. A low-energy, hydrogen-free method of diamond synthesis comprising:
    providing a deposition substrate; and
    converting fullerene to diamond in the presence of graphite, wherein said deposition substrate is subjected to a first temperature from about 550° C. to about 650° C.

* * * * *